United States Patent
Hsu et al.

(10) Patent No.: US 11,211,386 B2
(45) Date of Patent: Dec. 28, 2021

(54) SEMICONDUCTOR STRUCTURE AND MANUFACTURING METHOD THEREOF

(71) Applicant: Winbond Electronics Corp., Taichung (TW)

(72) Inventors: Ming-Chih Hsu, Taichung (TW); Yi-Hao Chien, Taichung (TW); Huang-Nan Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 214 days.

(21) Appl. No.: 16/409,893

(22) Filed: May 13, 2019

(65) Prior Publication Data

US 2020/0365597 A1 Nov. 19, 2020

(51) Int. Cl.
*H01L 27/108* (2006.01)
*H01L 23/528* (2006.01)

(52) U.S. Cl.
CPC .... *H01L 27/10885* (2013.01); *H01L 23/5283* (2013.01); *H01L 27/1085* (2013.01)

(58) Field of Classification Search
CPC ........... H01L 27/10885; H01L 23/5283; H01L 27/1085; G11C 11/4097; G11C 7/18
See application file for complete search history.

(56) References Cited

U.S. PATENT DOCUMENTS

2006/0205141 A1* 9/2006 Park ................. H01L 27/10855
438/239
2007/0155150 A1* 7/2007 Kim .................. H01L 21/76831
438/597
2007/0241378 A1* 10/2007 Aritome .............. H01L 27/0207
257/295

FOREIGN PATENT DOCUMENTS

| KR | 20060038595 | 5/2006 |
|----|-------------|--------|
| KR | 100672780 | 1/2007 |
| TW | 331659 | 5/1998 |
| TW | 371794 | 10/1999 |
| TW | 201724354 | 7/2017 |

OTHER PUBLICATIONS

"Office Action of Taiwan Counterpart Application", dated May 27, 2020, p. 1-p. 5.
"Office Action of Taiwan Counterpart Application," dated Sep. 4, 2019, p. 1-p. 4.

* cited by examiner

*Primary Examiner* — Hoang-Quan Ho
(74) *Attorney, Agent, or Firm* — JCIPRNET (57) ABSTRACT

A semiconductor structure and a manufacturing method thereof are provided. The semiconductor structure includes a substrate, a dielectric layer disposed on the substrate, bit lines disposed on the dielectric layer, spacers and a contact. The substrate has active areas arranged in parallel with each other. The bit lines are arranged in parallel with each other. Each bit line is partially overlapped with the corresponding active area. Each bit line has first portions and second portions arranged alternately in an extending direction thereof, and a width of the first portions is smaller than that of the second portions. The spacers are disposed on the sidewalls of each bit line. The contact is disposed between the adjacent bit lines and adjacent to the corresponding first portion of at least one of the adjacent bit lines, penetrates through the dielectric layer, and is in contact with the corresponding active area.

8 Claims, 6 Drawing Sheets

SEMICONDUCTOR STRUCTURE AND MANUFACTURING METHOD THEREOF

BACKGROUND

Technical Field

The present invention relates to a semiconductor structure and a manufacturing method thereof, and more particularly to a semiconductor structure capable of improving the resistivity of a contact between the adjacent bit lines and a manufacturing method thereof.

Description of Related Art

In the current dynamic random access memory (DRAM) process, after the bit lines are formed, a contact is formed through the underlying dielectric layer between the adjacent bit lines and electrically connected to the active area. The contact will also be electrically connected to the capacitor formed subsequently.

As the size of the device continues to shrink, the space between the adjacent devices also shrinks. Therefore, when forming a contact between the adjacent bit lines, the size of the contact must be reduced, and the contact area between the contact and the active area is also reduced. As a result, the amount of current flowing through the contact when operating the device is reduced to affect the device performance.

SUMMARY

The present invention provides a semiconductor structure, wherein the contact between the adjacent bit lines and the active area have a larger contact area.

The present invention provides a manufacturing method of a semiconductor structure for manufacturing the above-described semiconductor structure.

The semiconductor structure of the present invention includes a substrate, a dielectric layer, a plurality of bit lines, spacers and a contact. The substrate has a plurality of active areas arranged in parallel with each other. The dielectric layer is disposed on the substrate. The plurality of bit lines is disposed on the dielectric layer and arranged in parallel with each other, wherein each of the bit lines is partially overlapped with the corresponding active area, each of the bit lines has first portions and second portions arranged alternately in an extending direction thereof, and a width of the first portions is smaller than a width of the second portions. The spacers are disposed on sidewalls of each of the bit lines. The contact is disposed between the adjacent bit lines and adjacent to the corresponding first portion of at least one of the adjacent bit lines, penetrating through the dielectric layer, and being in contact with the corresponding active area.

In an embodiment of the semiconductor structure of the present invention, from a top view, in a direction perpendicular to an extending direction of the bit lines, a first distance between a sidewall of each of the first portions at a first side and a sidewall of each of the second portions at the first side does not exceed 5 nm, and a second distance between a sidewall of each of the first portions at a second side opposite to the first side and a sidewall of each of the second portions at the second side does not exceed 5 nm.

In an embodiment of the semiconductor structure of the present invention, from a top view, in a direction perpendicular to the extending direction of the bit lines, a first distance between a sidewall of each of the first portions at a first side and a sidewall of each of the second portions at the first side does not exceed 35% of the width of the second portions, and a second distance between a sidewall of each of the first portions at a second side opposite to the first side and a sidewall of each of the second portions at the second side does not exceed 35% of the width of the second portions.

In an embodiment of the semiconductor structure of the present invention, the first portions of the adjacent bit lines are arranged in a staggered manner.

The manufacturing method of the semiconductor structure of the present invention includes the following steps. A dielectric layer is formed on a substrate, wherein the substrate has a plurality of active areas arranged in parallel with each other. A plurality of bit lines is formed in parallel to each other on the dielectric layer, wherein each of the bit lines is partially overlapped with the corresponding active area, each of the bit lines has first portions and second portions arranged alternately in an extending direction thereof, and a width of the first portions is smaller than a width of the second portions. Spacers are formed on sidewalls of each of the bit lines. A contact is formed between the adjacent bit lines, wherein the contact is adjacent to the corresponding first portion of at least one of the adjacent bit lines, penetrates through the dielectric layer, and is in contact with the corresponding active area.

In an embodiment of the manufacturing method of the present invention, from a top view, in a direction perpendicular to the extending direction of the bit lines, a first distance between a sidewall of each of the first portions at a first side and a sidewall of each of the second portions at the first side does not exceed 5 nm, and a second distance between a sidewall of each of the first portions at a second side opposite to the first side and a sidewall of each of the second portions at the second side does not exceed 5 nm.

In an embodiment of the manufacturing method of the present invention, from a top view, in a direction perpendicular to the extending direction of the bit lines, a first distance between a sidewall of each of the first portions at a first side and a sidewall of each of the second portions at the first side does not exceed 35% of the width of the second portions, and a second distance between a sidewall of each of the first portions at a second side opposite to the first side and a sidewall of each of the second portions at the second side does not exceed 35% of the width of the second portions.

In an embodiment of the manufacturing method of the present invention, a method for forming the bit lines includes the following steps. A bit line material layer is formed on the dielectric layer. A plurality of mask patterns is formed in parallel to each other on the bit line material layer. A patterned photoresist layer is formed on the bit line material layer, wherein the patterned photoresist layer exposes a part of each of the mask patterns. An isotropic etching process is performed to partially remove the exposed part of each of the mask patterns to reduce a width of the exposed part of each of the mask patterns. The patterned photoresist layer is removed. An anisotropic etching process is performed, using the plurality of mask patterns as a mask, to partially remove the bit line material layer. The patterned photoresist layer is removed.

In an embodiment of the manufacturing method of the present invention, a method for forming the spacers includes the following steps. A spacer material layer is formed conformally on the dielectric layer after forming the plurality of bit lines. An anisotropic etching process is performed to partially remove the spacer material layer.

In an embodiment of the manufacturing method of the present invention, a method for forming the contact includes the following steps. A dielectric material layer is formed on the dielectric layer to cover the bit lines after forming the spacers. The dielectric material layer is partially removed to expose top surfaces of the bit lines. The dielectric material layer adjacent to the corresponding first portion and the underlying dielectric layer is removed to form an opening that exposes the corresponding active area. A conductive layer is formed in the opening.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The embodiments are described in detail below with reference to the accompanying drawings, but the embodiments are not intended to limit the scope of The present invention. In addition, the drawings are for illustrative purposes only and are not drawn to the original dimensions. For the sake of easy understanding, the same elements in the following description will be denoted by the same reference numerals.

In addition, the terms mentioned in the text, such as "comprising", "including" and "having" are all open-ended terms, i.e., meaning "including but not limited to".

In addition, the directional terms mentioned in the text, such as "on" and "under", are merely used to refer to the drawings and are not intended to limit The present invention.

FIGS. 1A to 1F are schematic top views showing a manufacturing process of a semiconductor structure according to the present invention. FIGS. 2A to 2F are schematic cross-sectional views taken along line I-I' of FIGS. 1A to 1F.

Figure 1A:
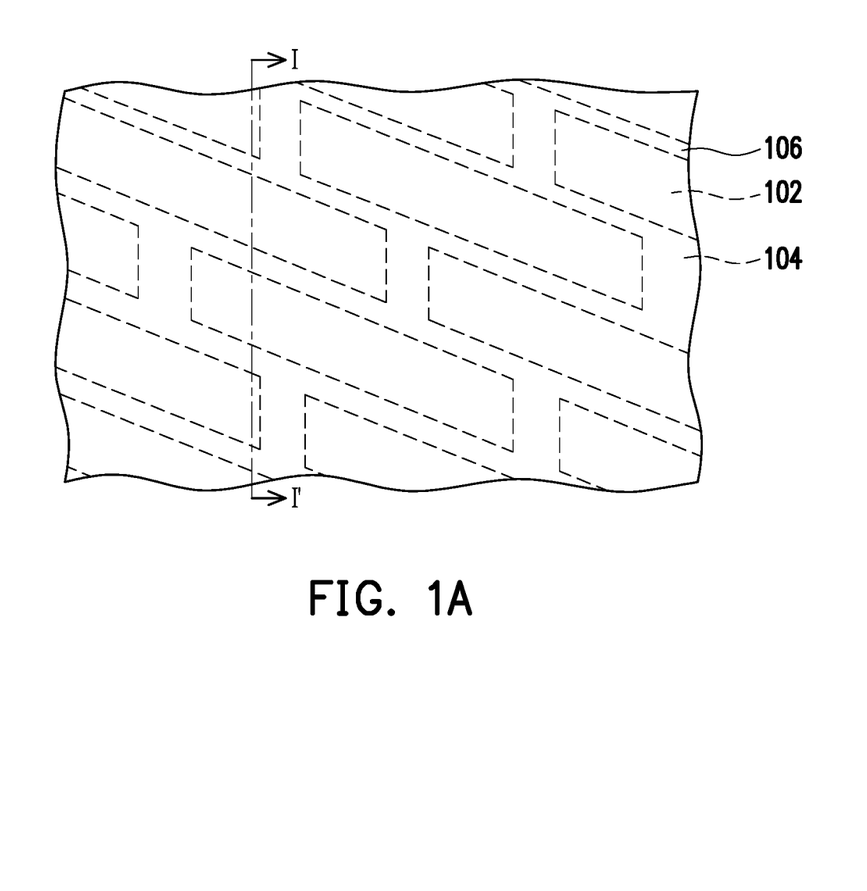
FIGS. 1A to 1F are schematic top views showing a manufacturing process of a semiconductor structure according to the present invention.
Figure 2A:
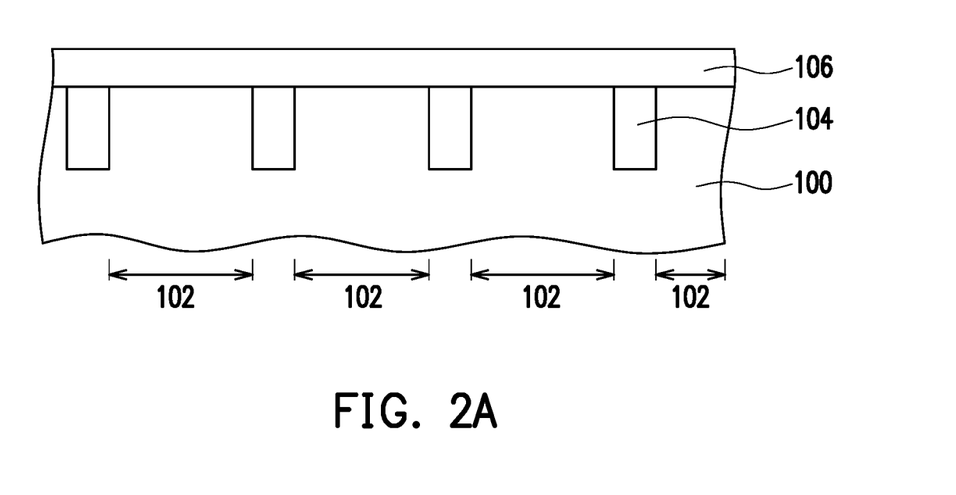
FIGS. 2A to 2F are schematic cross-sectional views taken along line I-I' of FIGS. 1A to 1F.

Referring to FIGS. 1A and 2A, a substrate 100 is provided. The substrate 100 is, for example, a silicon substrate. An isolation structure 104 is arranged in the substrate 100 for defining a plurality of active areas 102. The arrangement of the active areas 102 is not limited to the arrangement illustrated in FIG. 1A. The isolation structure 104 is, for example, shallow trench isolation (STI). In addition, various devices (for example, gate structure, source region, drain region, etc.) used to form a memory unit have been formed on and in the substrate 100. However, in order to make the drawings clear, the above various devices are omitted from the drawings. Then, a dielectric layer 106 is formed on the substrate 100. The dielectric layer 106 is, for example, an oxide layer, and the forming method thereof is, for example, a chemical vapor deposition (CVD) method. The dielectric layer 106 covers various devices on the substrate 100. In addition, an interconnection structure is formed in the dielectric layer 106. Similarly, in order to make the drawing clear, the interconnection structure is omitted in the figure.

Figure 1B:
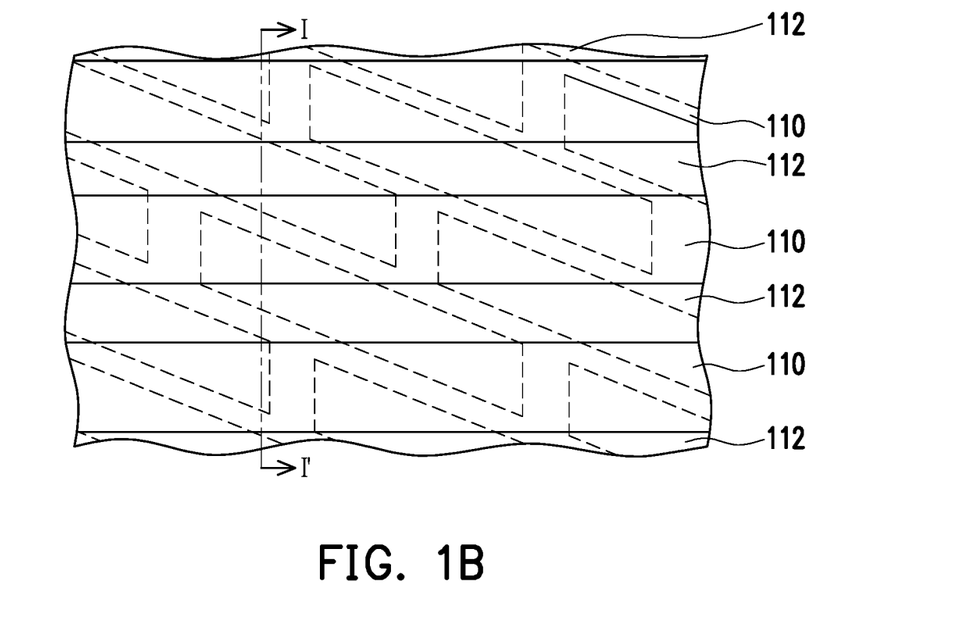
Figure 2B:
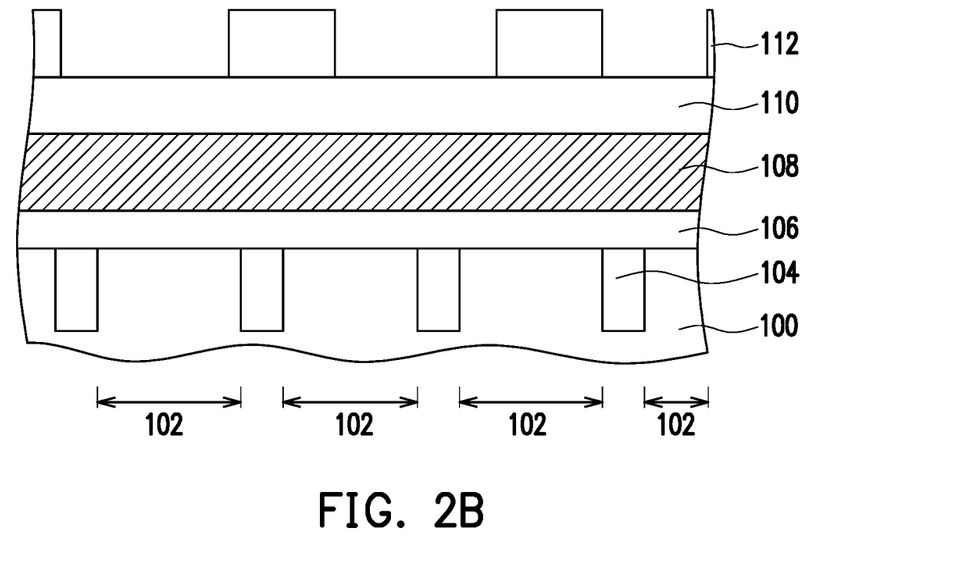

Referring to FIGS. 1B and 2B, a bit line material layer 108 is formed on the dielectric layer 106. The bit line material layer 108 is, for example, a polysilicon layer, but the present invention is not limited thereto. In other embodiments, depending on actual needs, the bit line material layer 108 may also be a composite layer composed of a polysilicon layer, a tungsten silicide layer and a silicon nitride layer. In addition, a hard mask material layer 110 may also be formed on the bit line material layer 108. The hard mask material layer 110 may be an oxide layer, a nitride layer, or a stacked layer composed of an oxide layer and a nitride layer, but the present invention is not limited thereto. In other embodiments, depending on actual needs, the hard mask material layer 110 may also be a single layer or a composite layer of other materials. Thereafter, a double patterning process may be performed to form a plurality of mask patterns 112 on the hard mask material layer 110. In other embodiments, depending on the actual situation, a general single patterning process can be used instead of the double patterning process. The mask patterns 112 are, for example, an oxide layer.

Figure 1C:
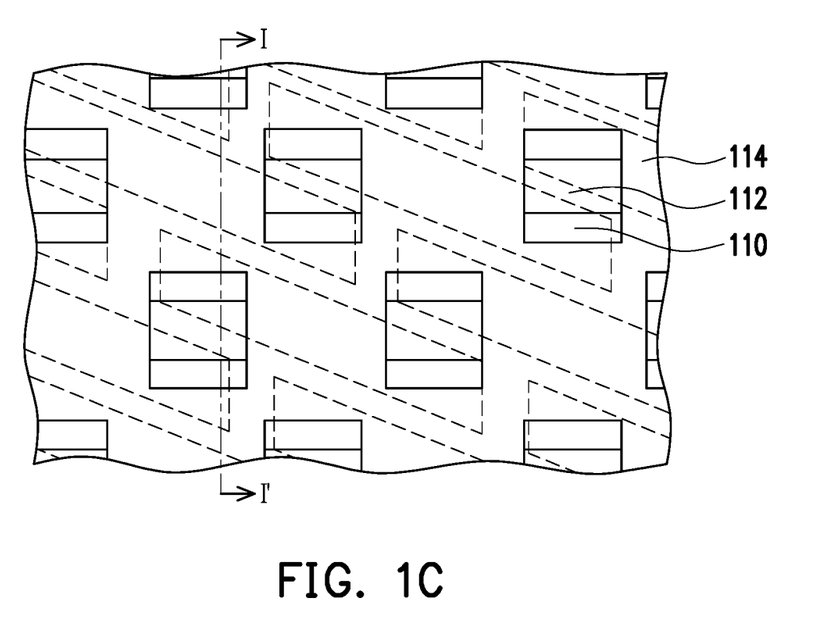
Figure 2C:
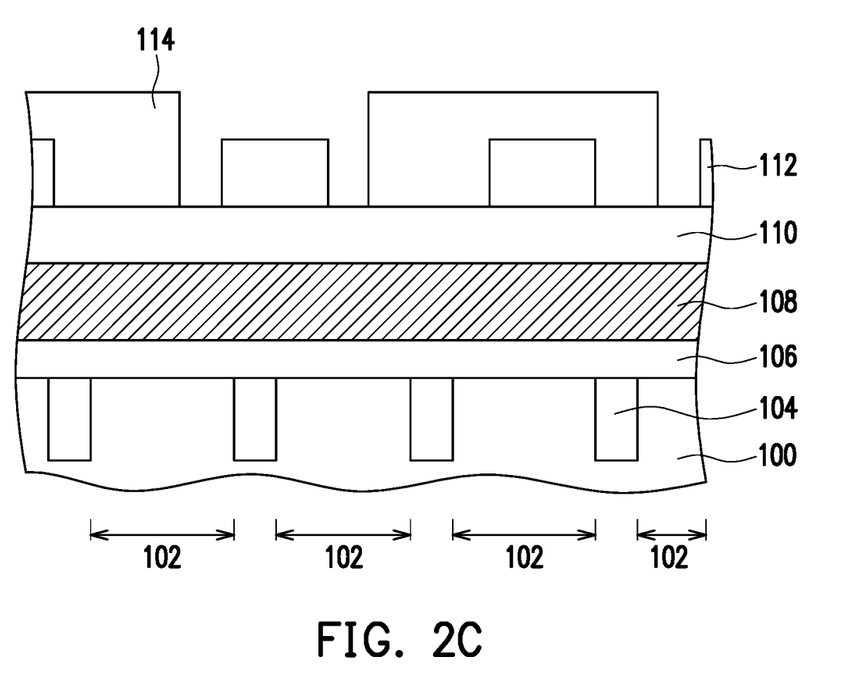

Referring to FIGS. 1C and 2C, a patterned photoresist layer 114 is formed on the hard mask material layer 110. The patterned photoresist layer 114 exposes a part of each of the mask patterns 112 corresponding to a region with a smaller width of the bit line to be formed. In the present embodiment, the regions exposed by the patterned photoresist layer 114 are arranged alternately, but the present invention is not limited thereto. In other embodiments, the regions exposed by the patterned photoresist layer 114 can be adjusted depending on the actual layout requirements.

Figure 1D:
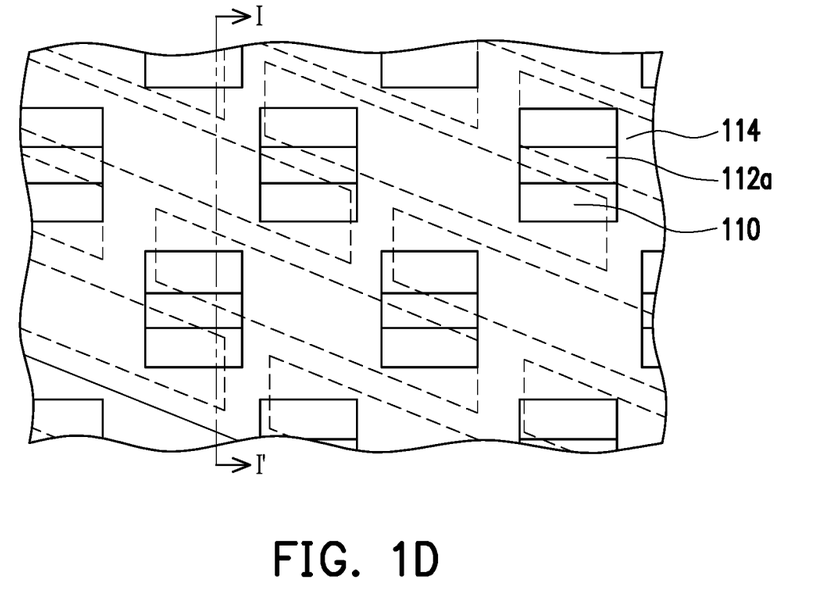
Figure 2D:
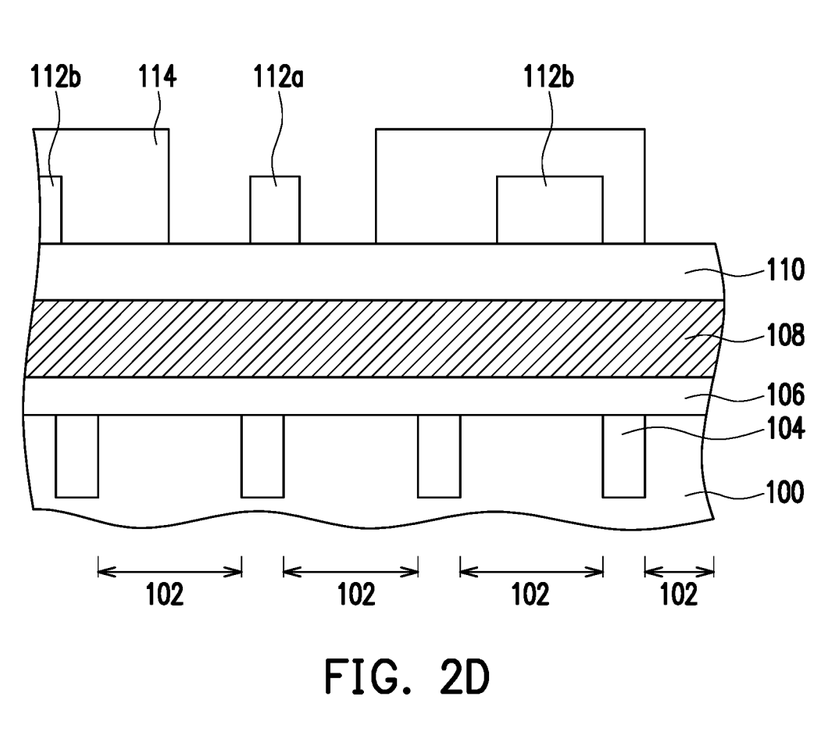

Referring to FIGS. 1D and 2D, an isotropic etching process is performed to partially remove the exposed mask patterns 112 to reduce the width of the exposed mask patterns 112. The isotropic etching process is, for example, a wet etching process using buffered hydrofluoric acid (BHF). In this way, each of the mask patterns 112 can have first portions 112a having a smaller width and second portions 112b having a larger width, wherein the first portions 112a correspond to regions with a smaller width of the bit line to be formed. The mask patterns 112 serve as a mask when the bit line material layer 108 is patterned into a plurality of bit lines. Since the mask patterns 112 has first portions 112a having a smaller width and second portions 112b having a larger width, the bit line formed subsequently may have portions having a smaller width and portions having a larger width. This will be further explained below.

Figure 1E:
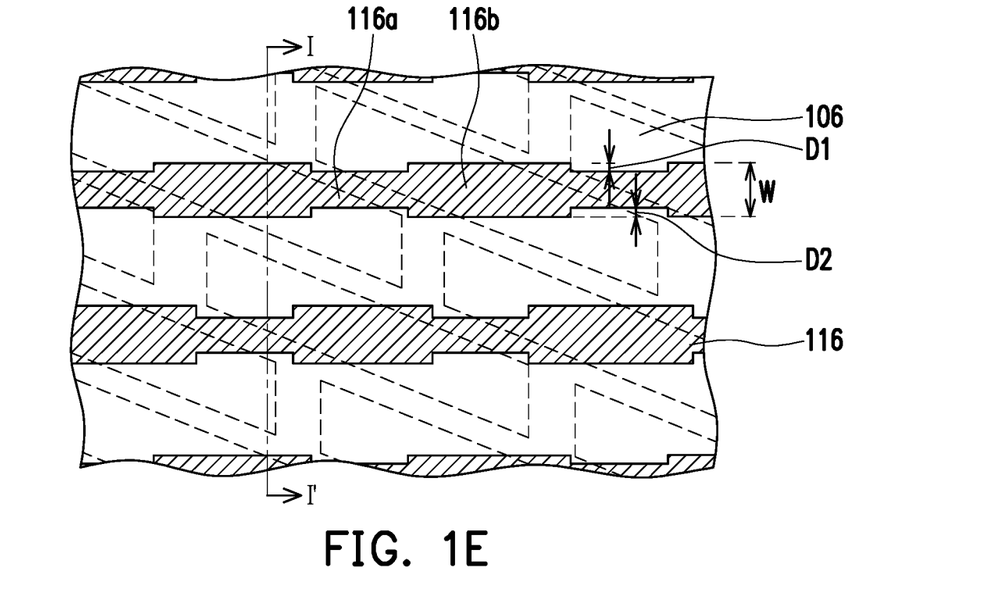
Figure 2E:
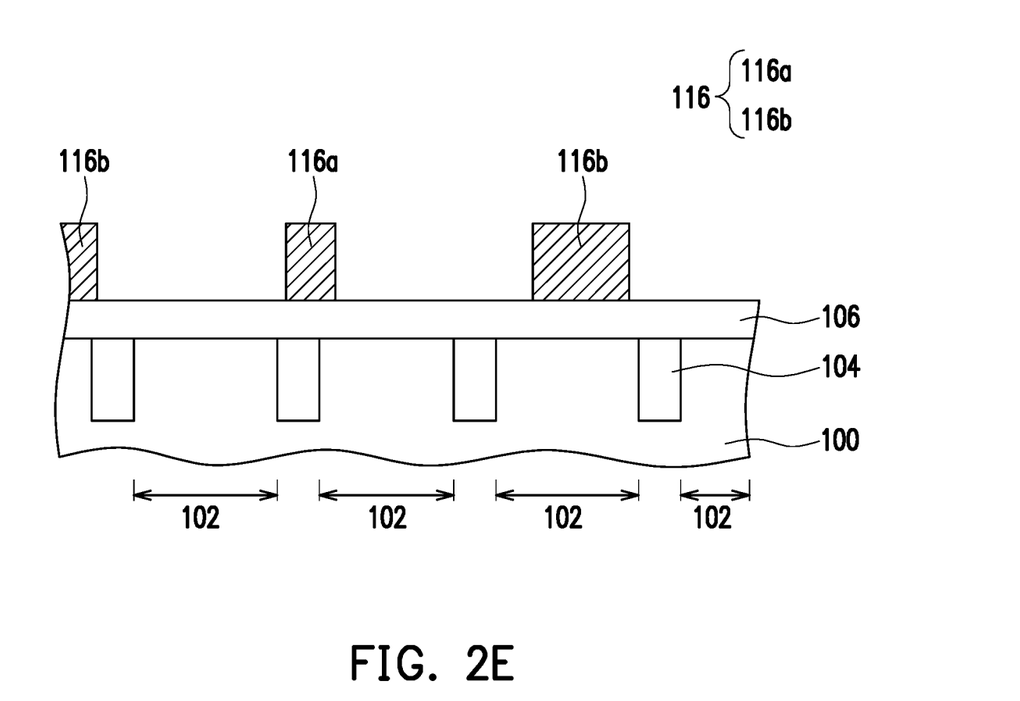

Referring to FIGS. 1E and 2E, the patterned photoresist layer 114 is removed. Then, using the mask patterns 112 as an etching mask, an anisotropic etching process is performed to partially remove the hard mask material layer 110 to form a hard mask pattern (not shown). Next, an anisotropic etching process is performed, using the hard mask pattern as an etching mask, to partially remove the bit line material layer 108 so as to form bit lines 116 each having first portions 116a having a smaller width and second portions 116b having a larger width.

In the present embodiment, the width of the formed first portion 112a is adjusted by controlling the removal amount of the mask patterns 112 described in FIGS. 1D and 2D, thereby obtaining the desired width of the first portions 116a of bit lines 116. As shown in FIG. 1E, from the top view, in a direction perpendicular to the extending direction of the bit lines 116, a distance D1 between the sidewall of each of the first portions 116a at one side and the sidewall of each of the second portions 116b at the same side does not exceed 5 nm, and a distance D2 between the sidewall of each of the first portions 116a at opposite side and the sidewall of each of the second portions 116b at the same side does not exceed 5 nm. In another embodiment, the distance D1 does not exceed 35% of the width W of the second portions 116b, and the distance D2 does not exceed 35% of the width W of the second portions 116b. Further, in the present embodiment, the distance D1 is equal to the distance D2, but the present invention is not limited thereto. In other embodiments, depending on the actual layout requirements, distance D1 and distance D2 can be different from each other.

Figure 1F:
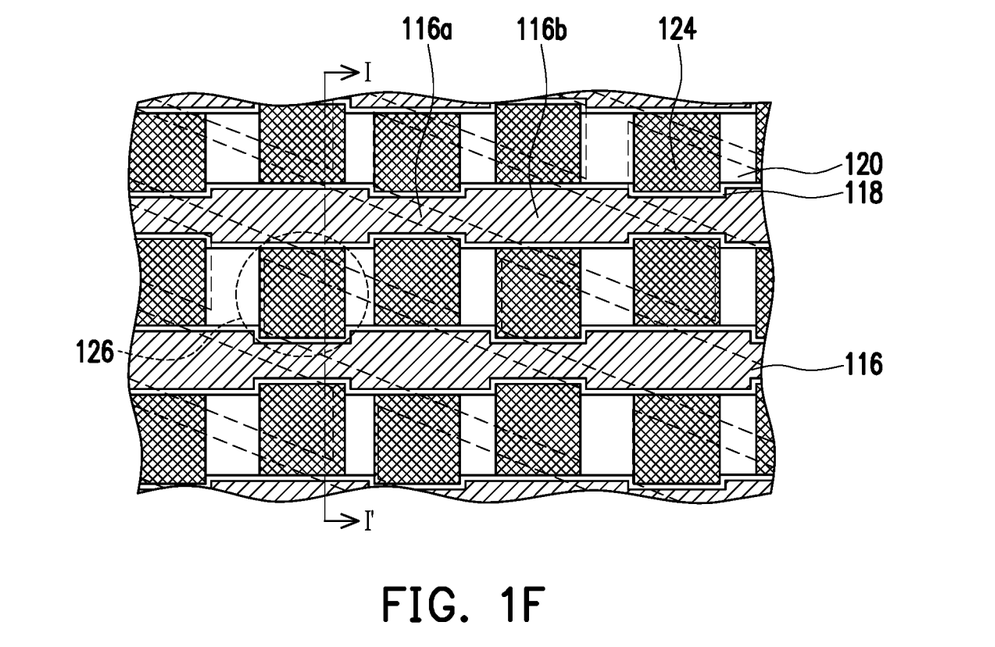
Figure 2F:
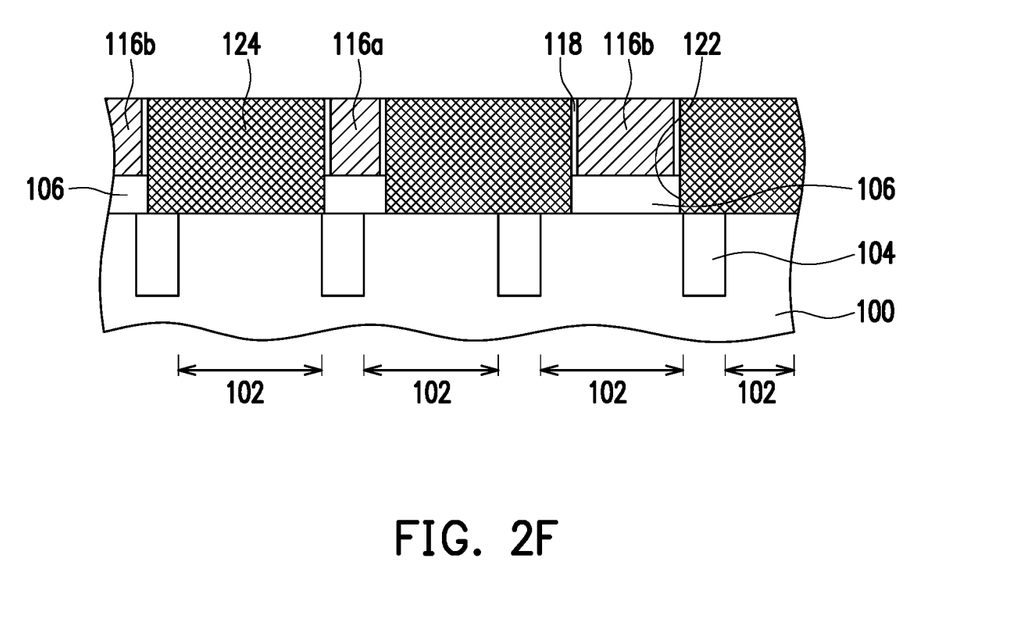

Referring to FIGS. 1F and 2F, spacers 118 are formed on the sidewalls of the bit lines 116. The spacers 118 are, for example, a nitride layer. The spacers 118 are formed by, for example, forming a spacer material layer conformally on the dielectric layer 106, and then performing an anisotropic etching process to partially remove the spacer material layer. Then, a dielectric layer material layer is formed on the dielectric layer 106 to cover the bit lines 116 and the spacers 118. Thereafter, for example, a chemical mechanical polishing process (CMP) is performed to partially remove the dielectric material layer to expose the top surfaces of the bit lines 116 and form a dielectric layer 120 between the bit lines 116. Next, the dielectric layer 120 adjacent the corresponding first portion 116a and the underlying dielectric layer 106 are removed to form openings 122 each exposing the corresponding active area 102. Thereafter, a conductive layer is filled in the openings 122 to form a contact 124 in each opening 122 in the dielectric layer 120 and the dielectric layer 106 to contact with the corresponding active area 102. The contacts 124 are used to electrically connect the subsequently formed device (for example, a capacitor) with the active areas 102.

In the present embodiment, each bit line 116 has first portions 116a having a smaller width and second portions 116b having a larger width, and contacts 124 between the bit lines 116 are disposed adjacent to the first portions 116a. As a result, as compared to a case that each of bit lines has a uniform width, each contact 124 can have a larger size and a lower resistance, and the contact 124 and the corresponding active area 102 can have a larger contact area. As a result, the amount of current flowing through the contact 124 and the corresponding active area 102 is increased when the device is operated, thereby improving the electrical performance of the device. As shown by the region 126 in FIG. 1F, the contact 124 is increased in size and the contact area with the corresponding active area 102 as compared to a case that each of bit lines has a uniform width.

Further, in the present embodiment, the distances D1 and D2 between the sidewall of the first portion 116a and the sidewall of the second portion 116b do not exceed 5 nm, or the distances D1 and D2 do not exceed 35% of the width W of the second portion 116b. In this way, when reducing the width of the bit line 116 to increase the size of the contact 124, the resistance of the bit line 116 can be maintained at a desired level without leading to an excessive increase in resistance due to excessively reducing the width of the bit line 116, which affects the electrical performance of the device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor structure, comprising:
    a substrate, having a plurality of active areas arranged in parallel with each other;
    a dielectric layer, disposed on the substrate;
    a plurality of bit lines, disposed on the dielectric layer and arranged in parallel with each other, wherein each of the bit lines is partially overlapped with a corresponding active area, each of the bit lines has first portions and second portions arranged alternately in an extending direction thereof, and a width of the first portions is smaller than a width of the second portions;
    spacers, disposed on sidewalls of each of the bit lines; and
    a contact, disposed between adjacent bit lines and adjacent to a corresponding first portion of at least one of the adjacent bit lines, penetrating through the dielectric layer, and being in contact with a corresponding active area,
    wherein, from a top view, in a direction perpendicular to the extending direction of the bit lines, a first distance between a sidewall of each of the first portions at a first side and a sidewall of each of the second portions at the first side does not exceed 35% of the width of the second portions, and a second distance between a sidewall of each of the first portions at a second side opposite to the first side and a sidewall of each of the second portions at the second side does not exceed 35% of the width of the second portions.

2. The semiconductor structure of claim 1, wherein, from a top view, in a direction perpendicular to the extending direction of the bit lines, a first distance between the sidewall of each of the first portions at a first side and the sidewall of each of the second portions at the first side does not exceed 5 nm, and a second distance between the sidewall of each of the first portions at a second side opposite to the first side and the sidewall of each of the second portions at the second side does not exceed 5 nm.

3. The semiconductor structure of claim 1, wherein the first portions of the adjacent bit lines are arranged in a staggered manner.

4. A manufacturing method of a semiconductor structure, comprising:
    forming a dielectric layer on a substrate, wherein the substrate has a plurality of active areas arranged in parallel with each other;
    forming a plurality of bit lines in parallel to each other on the dielectric layer, wherein each of the bit lines is partially overlapped with a corresponding active area, each of the bit lines has first portions and second portions arranged alternately in an extending direction thereof, and a width of the first portions is smaller than a width of the second portions;
    forming spacers on sidewalls of each of the bit lines;
    forming a contact between adjacent bit lines, wherein the contact is adjacent to a corresponding first portion of at least one of the adjacent bit lines, penetrates through the dielectric layer, and is in contact with a corresponding active area,
    wherein, from a top view, in a direction perpendicular to the extending direction of the bit lines, a first distance between a sidewall of each of the first portions at a first side and a sidewall of each of the second portions at the first side does not exceed 35% of the width of the second portions, and a second distance between a sidewall of each of the first portions at a second side opposite to the first side and a sidewall of each of the second portions at the second side does not exceed 35% of the width of the second portions.

5. The manufacturing method of claim 4, wherein, from a top view, in a direction perpendicular to the extending direction of the bit lines, a first distance between the sidewall of each of the first portions at a first side and the sidewall of each of the second portions at the first side does not exceed 5 nm, and a second distance between the sidewall of each of the first portions at a second side opposite to the first side and the sidewall of each of the second portions at the second side does not exceed 5 nm.

6. The manufacturing method of claim 4, wherein a method for forming the bit lines comprises:
   forming a bit line material layer on the dielectric layer;
   forming a plurality of mask patterns in parallel to each other on the bit line material layer;
   forming a patterned photoresist layer on the bit line material layer, wherein the patterned photoresist layer exposes a part of each of the mask patterns;
   performing an isotropic etching process to partially remove the exposed part of each of the mask patterns to reduce a width of the exposed part of each of the mask patterns;
   removing the patterned photoresist layer;
   performing an anisotropic etching process, using the plurality of mask patterns as a mask, to partially remove the bit line material layer; and
   removing the plurality of mask patterns.

7. The manufacturing method of claim 4, wherein a method for forming the spacers comprises:
   forming a spacer material layer conformally on the dielectric layer after forming the plurality of bit lines; and
   performing an anisotropic etching process to partially remove the spacer material layer.

8. The manufacturing method of claim 4, wherein a method for forming the contact comprises:
   forming a dielectric material layer on the dielectric layer to cover the bit lines after forming the spacers;
   partially removing the dielectric material layer to expose top surfaces of the bit lines;
   removing the dielectric material layer adjacent to the corresponding first portion and the dielectric layer thereunder to form an opening that exposes the corresponding active area; and
   forming a conductive layer in the opening.

* * * * *